United States Patent
Campbell et al.

(10) Patent No.: US 8,922,998 B2
(45) Date of Patent: Dec. 30, 2014

(54) COOLANT MANIFOLD WITH SEPARATELY ROTATABLE MANIFOLD SECTION(S)

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Woodstock, NY (US); Eric J. McKeever, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 13/281,495

(22) Filed: Oct. 26, 2011

(65) Prior Publication Data
US 2013/0107457 A1 May 2, 2013

(51) Int. Cl.
G06F 1/20 (2006.01)
H05K 5/00 (2006.01)
H05K 7/20 (2006.01)
F28D 7/10 (2006.01)
F28D 7/12 (2006.01)
F28D 7/02 (2006.01)
F28F 3/12 (2006.01)
F28F 1/10 (2006.01)
F28F 1/00 (2006.01)

(52) U.S. Cl.
CPC .......... *H05K 7/20272* (2013.01); *H05K 7/2079* (2013.01)
USPC ................ 361/699; 361/679.46; 361/679.53; 361/679.54; 361/688; 361/689; 361/701; 361/702; 361/704; 361/707; 361/709; 361/711; 165/154; 165/155; 165/156; 165/157; 165/164; 165/168; 165/172; 165/177

(58) Field of Classification Search
CPC ... H05K 7/20; H05K 7/20218; H05K 7/2039; H05K 7/20254; F28D 7/10; F28D 7/106; F28D 7/0066; F28D 7/0075; F28D 7/103
USPC ................ 361/699, 679.46, 679.49, 679.53, 361/679.54, 688, 689, 701, 702, 704, 707, 361/709–711, 714; 165/154–157, 164, 168, 165/172, 177
See application file for complete search history.

(56) References Cited

U.S. PATENT DOCUMENTS

| | | | |
|---|---|---|---|
| 4,771,366 A | | 9/1988 | Blake et al. |
| 5,370,178 A | * | 12/1994 | Agonafer et al. ............. 165/137 |

(Continued)

FOREIGN PATENT DOCUMENTS

| | | |
|---|---|---|
| JP | 2003-249783 A | 9/2009 |
| JP | 2011-518395 A | 6/2011 |
| WO | WO2013/063250 A1 | 5/2013 |

OTHER PUBLICATIONS

Cannistra et al., "Module Board Service Frame", IBM Technical Disclosure Bulletin, vol. 22, No. 2 (Jul. 1979).

(Continued)

*Primary Examiner* — Anthony Haughton
*Assistant Examiner* — Zhengfu Feng
(74) *Attorney, Agent, or Firm* — Steven Chiu, Esq.; Kevin P. Radigan, Esq.; Heslin Rothenberg Farley & Mesiti P.C.

(57) ABSTRACT

A cooling apparatus is provided which includes one or more coolant-cooled structures attached to one or more electronic components, one or more coolant conduits, and one or more coolant manifolds. The coolant-cooled structure(s) includes one or more coolant-carrying channels, and the coolant manifolds includes one or more rotatable manifold sections. One coolant conduit couples in fluid communication a respective rotatable manifold section and the coolant-carrying channel(s) of a respective coolant-cooled structure. The respective rotatable manifold section is rotatable relative to another portion of the coolant manifold to facilitate detaching of the coolant-cooled structure from its associated electronic component while maintaining the coolant-cooled structure in fluid communication with the respective rotatable manifold section through the one coolant conduit, which in one embodiment, is a substantially rigid coolant conduit.

16 Claims, 14 Drawing Sheets

(56) References Cited

U.S. PATENT DOCUMENTS

| | | | |
|---|---|---|---|
| 6,069,791 A * | 5/2000 | Goto et al. | 361/679.54 |
| 6,125,035 A | 9/2000 | Hood et al. | |
| 6,134,106 A | 10/2000 | Tao et al. | |
| 6,137,683 A * | 10/2000 | Lee et al. | 361/704 |
| 6,477,773 B1 | 11/2002 | Wilson et al. | |
| 6,889,515 B2 * | 5/2005 | Tilton et al. | 62/259.2 |
| 6,989,990 B2 | 1/2006 | Malone et al. | |
| 7,558,062 B2 | 7/2009 | Wang et al. | |
| 7,855,888 B2 | 12/2010 | Peterson | |
| 7,905,106 B2 | 3/2011 | Attlesey | |
| 7,911,793 B2 | 3/2011 | Attlesey | |
| 7,963,119 B2 | 6/2011 | Campbell et al. | |
| 2005/0243517 A1 | 11/2005 | Malone et al. | |
| 2006/0067047 A1 | 3/2006 | Pfahnl | |
| 2008/0174962 A1 | 7/2008 | Belady et al. | |
| 2010/0226106 A1 | 9/2010 | Suarez et al. | |
| 2011/0197612 A1 | 8/2011 | Campbell et al. | |
| 2013/0105116 A1 * | 5/2013 | Campbell et al. | 165/80.4 |

OTHER PUBLICATIONS

Campbell et al., International Search Report for PCT/US2012/061895 (PCT Publication No. WO 2013/063250 A1), dated Mar. 18, 2013 (2 pages).

Campbell et al., Office Action for U.S. Appl. No. 13/705,283, filed Dec. 5, 2012 (U.S. Patent Publication No. 2013/0105116 A1), dated Sep. 4, 2014 (10 pages).

* cited by examiner

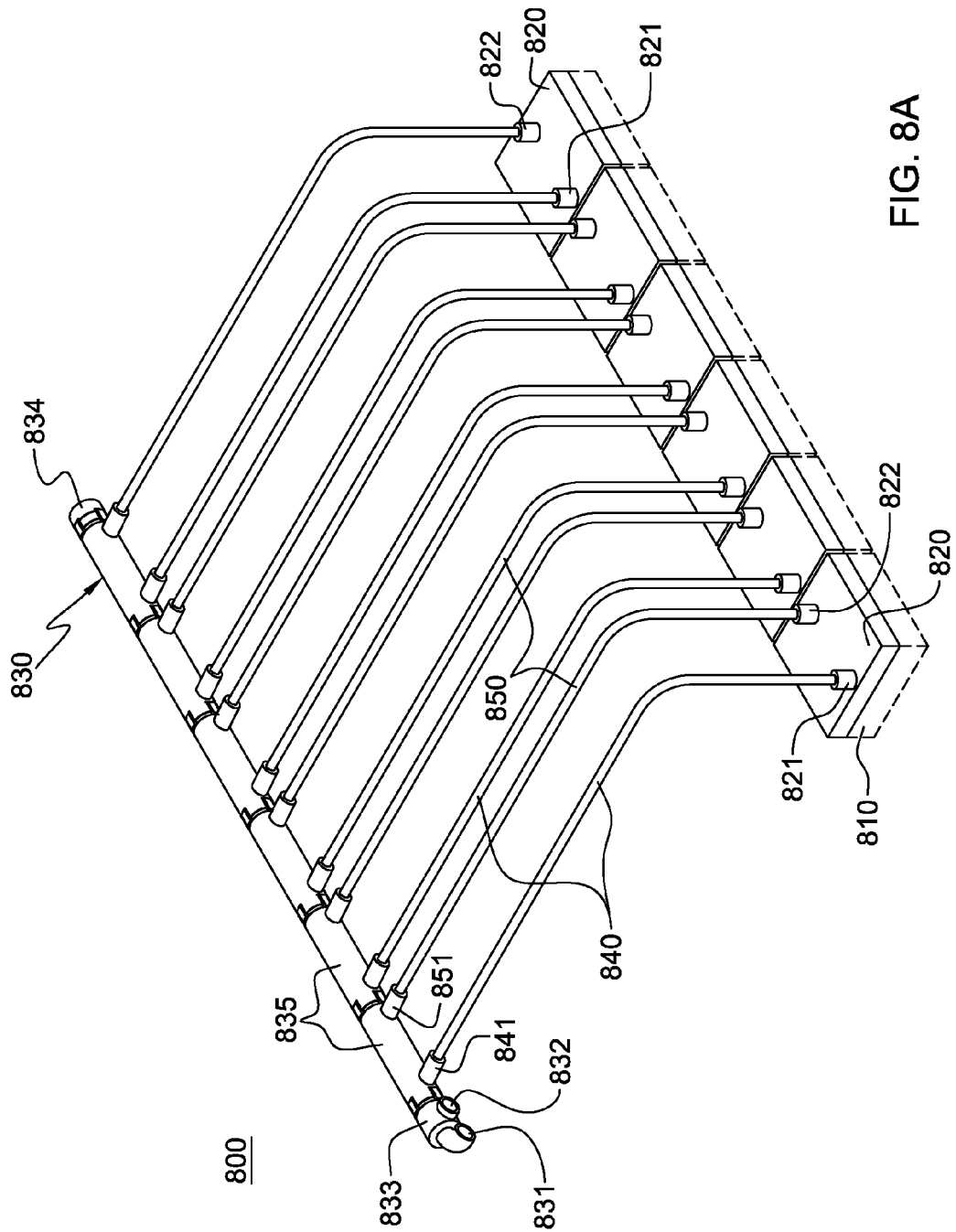

COOLANT MANIFOLD WITH SEPARATELY ROTATABLE MANIFOLD SECTION(S)

BACKGROUND

The power dissipation of integrated circuit chips, and the modules containing the chips, continues to increase in order to achieve increases in processor performance. This trend poses a cooling challenge at both the module and system levels. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

In one aspect, provided herein is cooling apparatus which includes: at least one coolant-cooled structure configured to attach to at least one electronic component to be cooled; at least one coolant conduit; and at least one coolant manifold comprising at least one rotatable manifold section. One coolant-cooled structure of the at least one coolant-cooled structure includes at least one coolant-carrying channel, and one coolant conduit of the at least one coolant conduit is coupled in fluid communication with the at least one coolant-carrying channel of the one coolant-cooled structure. The one coolant conduit is also coupled in fluid communication with a respective rotatable manifold section of the at least one rotatable manifold section to facilitate flow of coolant through the at least one coolant-cooled channel of the one coolant-cooled structure. The respective rotatable manifold section is rotatable relative to another portion of the coolant manifold to facilitate detaching of the one coolant-cooled structure from a respective electronic component of the at least one electronic component while maintaining the one coolant-cooled structure in fluid communication with the respective rotatable manifold section through the one coolant conduit.

In another aspect, provided herein is a cooled electronic system which includes at least one electronic component, and a cooling apparatus attached to the at least one electronic component. The cooling apparatus facilitates removal of heat from the at least one electronic component, and includes: at least one coolant-cooled structure attached to the at least one electronic component; at least one coolant conduit; and at least one coolant manifold comprising at least one rotatable manifold section. One coolant-cooled structure of the at least one coolant-cooled structure includes at least one coolant-carrying channel, and one coolant conduit of the at least one coolant conduit is coupled in fluid communication with the at least one coolant-carrying channel of the one coolant-cooled structure. The one coolant conduit is also coupled in fluid communication with a respective rotatable manifold section of the at least one rotatable manifold section to facilitate flow of coolant through the at least one coolant-cooled channel of the at least one coolant-cooled structure. The respective rotatable manifold section is rotatable relative to another portion of the coolant manifold to facilitate detaching of the one coolant-cooled structure from a respective electronic component of the at least one electronic component while maintaining the one coolant-cooled structure in fluid communication with the respective rotatable manifold section through the one coolant conduit.

In a further aspect, a method is provided for facilitating cooling of at least one electronic component. The method includes: providing at least one coolant-cooled structure configured to attach to the at least one electronic component, one coolant-cooled structure of the at least one coolant-cooled structure comprising at least one coolant-carrying channel; providing at least one coolant conduit, one coolant conduit of the at least one coolant conduit being coupled in fluid communication with the at least one coolant-carrying channel of the one coolant-cooled structure; and providing at least one coolant manifold comprising at least one rotatable manifold section, the one coolant conduit being coupled in fluid communication with a respective rotatable manifold section of the at least one rotatable manifold section to facilitate flow of coolant through the at least one coolant-carrying channel of the one coolant-cooled structure, wherein the respective rotatable manifold section is rotatable relative to another portion of the at least one coolant manifold to facilitate detaching of the one coolant-cooled structure from a respective electronic component of the at least one electronic component while maintaining the one coolant-cooled structure in fluid communication with a respective rotatable manifold section through the one coolant conduit.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8A depicts an alternate embodiment of a cooling apparatus comprising an integrated coolant manifold shown with multiple rotatable manifold sections, in accordance with one or more aspects of the present invention;

DETAILED DESCRIPTION

Figure 1:
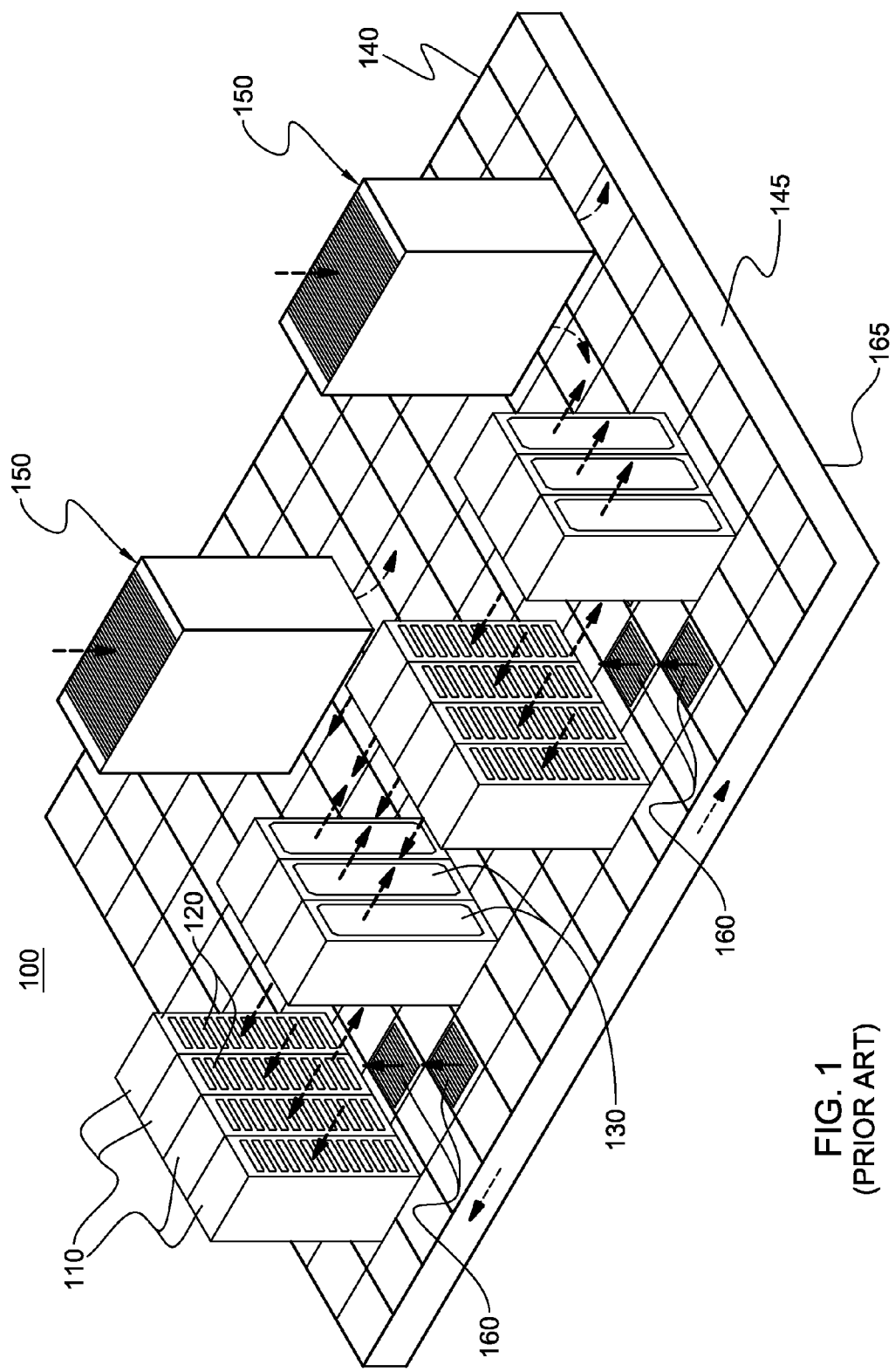
FIG. 1 depicts one embodiment of a conventional raised floor layout of an air-cooled data center.

As used herein, the terms "electronics rack", and "rack-mounted electronic equipment" are used interchangeably, and unless otherwise specified include any housing, frame, rack, compartment, blade server system, etc., having one or more heat-generating components of a computer system or electronics system, and may be, for example, a stand-alone computer processor having high, mid or low end processing capability. In one embodiment, an electronics rack may comprise multiple electronic subsystems. "Electronic subsystem" refers to any sub-housing, blade, book, drawer, node, compartment, etc., of an electronics rack having one or more heat-generating electronic components disposed therein or thereon. An electronic subsystem of an electronics rack may be movable or fixed relative to the electronics rack, with the rack-mounted electronics drawers of a multi-drawer rack unit and blades of a blade center system being two examples of subsystems of an electronics rack to be cooled. In one specific example, "electronic subsystem" refers to an electronic system which comprises multiple different types of electronic components, and may be, in one example, a server node of a multi-server rack.

"Electronic component" refers to any heat-generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, an electronic component may comprise one or more bare dies or one or more packaged dies disposed on a common carrier. As used herein, "primary heat-generating component" refers to a primary heat-generating electronic component within an electronic subsystem, while "secondary heat-generating component" refers to an electronic component of the electronic subsystem generating less heat than the primary heat-generating component to be cooled. Further, unless otherwise specified herein, the terms "liquid-cooled structure" or "liquid-cooled cold plate" refer to any conventional thermally conductive structure having one or more channels or passageways formed therein or thereon for flowing of liquid coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of a liquid coolant (for example, the facility or system coolants discussed below) is water. However, the concepts disclosed herein are readily adapted to use with other types of coolant. For example, one or more of the coolants may comprise a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, cooled air enters the data center via perforated floor tiles 160 from a cool air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the data center. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of electronics racks 110.

Due to the ever-increasing airflow requirements through electronics racks, and the limits of air distribution within the typical data center installation, liquid-assisted cooling is being combined with the conventional air-cooling. FIGS. 2-6 illustrate one embodiment of a data center implementation employing a liquid-assisted cooling system with one or more cold plates coupled to high heat-generating electronic components disposed within the electronics racks.

Figure 2:
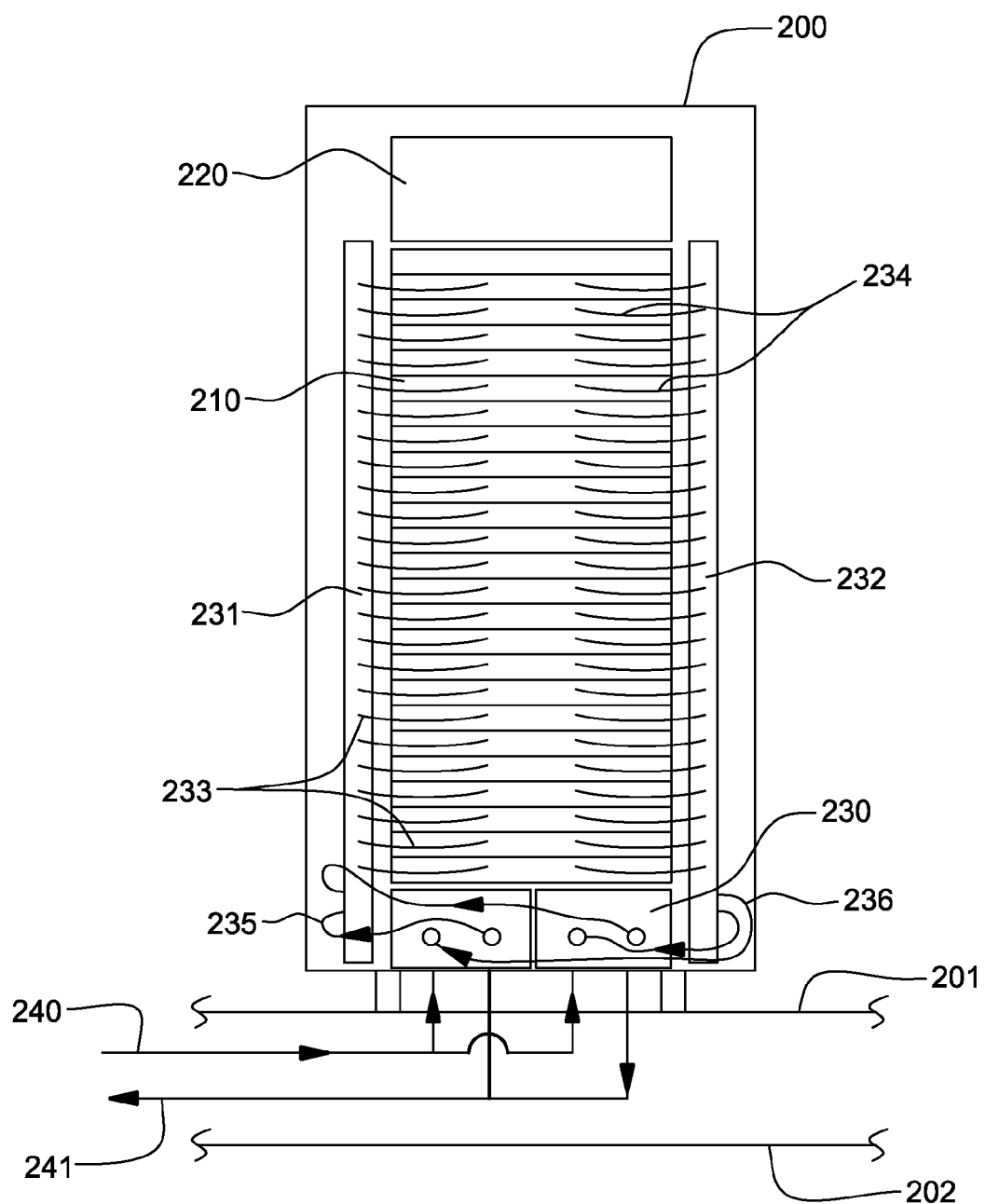
FIG. 2 is a front elevational view of one embodiment of an at least partially liquid-cooled electronics rack comprising multiple electronic subsystems, in accordance with one or more aspects of the present invention.

FIG. 2 depicts one embodiment of a partially liquid-cooled electronics rack 200. As illustrated, liquid-cooled electronics rack 200 comprises a plurality of electronic subsystems 210, which may be processor or server nodes. A bulk power regulator 220 is shown disposed at an upper portion of liquid-cooled electronics rack 200, and two coolant conditioning units (CCUs) 230 are disposed in a lower portion of the liquid-cooled electronics rack. In the embodiments described herein, the coolant is assumed to be water or an aqueous-based solution (by way of example only).

In addition to CCUs 230, the cooling system includes a system water supply manifold 231, a system water return manifold 232, and manifold-to-node fluid connect hoses 233 coupling system water supply manifold 231 to electronic subsystems 210, and node-to-manifold fluid connect hoses 234 coupling the individual electronic subsystems 210 to system water return manifold 232. Each CCU 230 is in fluid communication with system water supply manifold 231 via a respective system water supply hose 235, and each CCU 230 is in fluid communication with system water return manifold 232 via a respective system water return hose 236.

As illustrated, a portion of the heat load of the electronic subsystems is transferred from the system water to cooler facility water supplied by facility water supply line 240 and facility water return line 241 disposed, in the illustrated embodiment, in the space between a raised floor 201 and a base floor 202.

Figure 3:
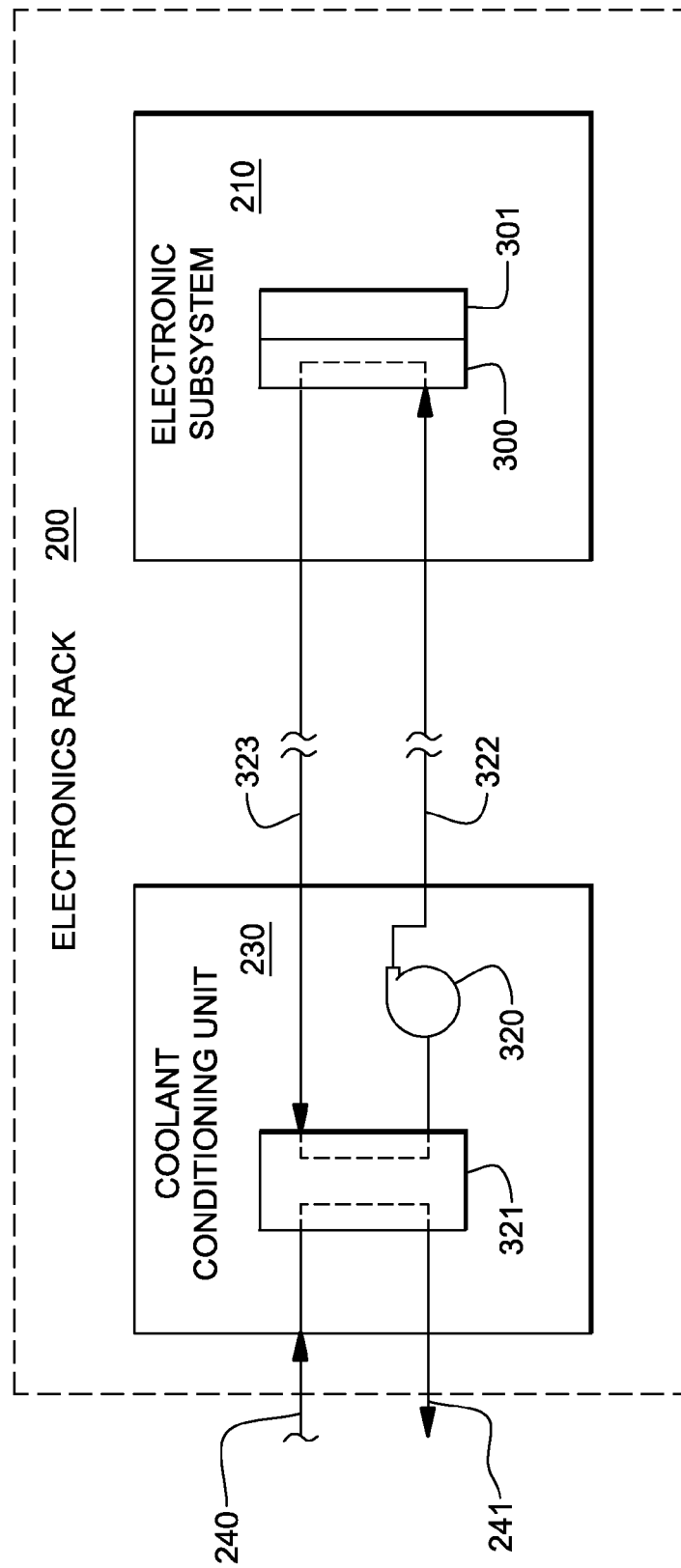
FIG. 3 is a schematic of one embodiment of an electronics rack, wherein an electronic module (or component) is liquid-cooled by system coolant (provided by one or more coolant conditioning units disposed within the electronics rack) pass

FIG. 3 schematically illustrates operation of the cooling system of FIG. 2, wherein a liquid-cooled cold plate 300 is shown coupled to an electronic module 301 of an electronic subsystem 210 within the liquid-cooled electronics rack 200. Heat is removed from electronic module 301 via the system coolant circulated via pump 320 through cold plate 300 within the system coolant loop defined by liquid-to-liquid heat exchanger 321 of coolant conditioning unit 230, lines 322, 323 and cold plate 300. The system coolant loop and coolant conditioning unit are designed to provide coolant of a controlled temperature and pressure, as well as controlled chemistry and cleanliness to the electronic module(s). Furthermore, the system coolant is physically separate from the less controlled facility coolant in lines 240, 241, to which heat is ultimately transferred.

Figure 4:
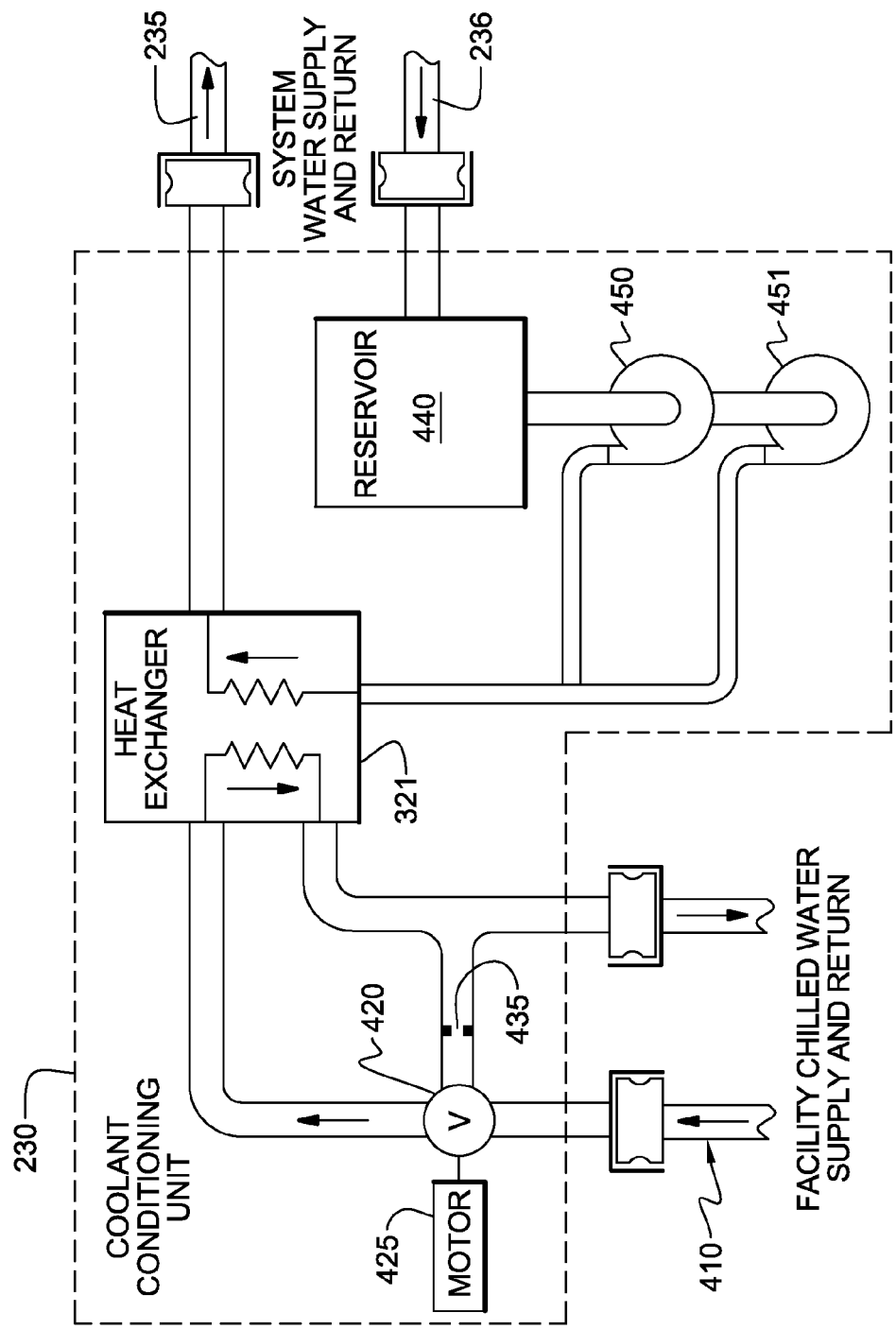
- FIG. 4 is a schematic of one embodiment of a coolant conditioning unit disposed within a liquid-cooled electronics rack, in accordance with one or more aspects of the present invention.

FIG. 4 depicts a more detailed embodiment of a coolant conditioning unit 230. As shown in FIG. 4, coolant conditioning unit 230 includes a first coolant loop wherein chilled, facility coolant is supplied 410 and passes through a control valve 420 driven by a motor 425. Valve 420 determines an amount of facility coolant to be passed through heat exchanger 321, with a portion of the facility coolant possibly being returned directly via a bypass orifice 435. The coolant conditioning unit further includes a second coolant loop with a reservoir tank 440 from which system coolant is pumped, either by pump 450 or pump 451, into the heat exchanger 321 for conditioning and output thereof, as cooled system coolant to the electronics rack to be cooled. The cooled system coolant is supplied to the system water supply manifold and system water return manifold of the liquid-cooled electronics rack via the system water supply hose 235 and system water return hose 236.

Figure 5:
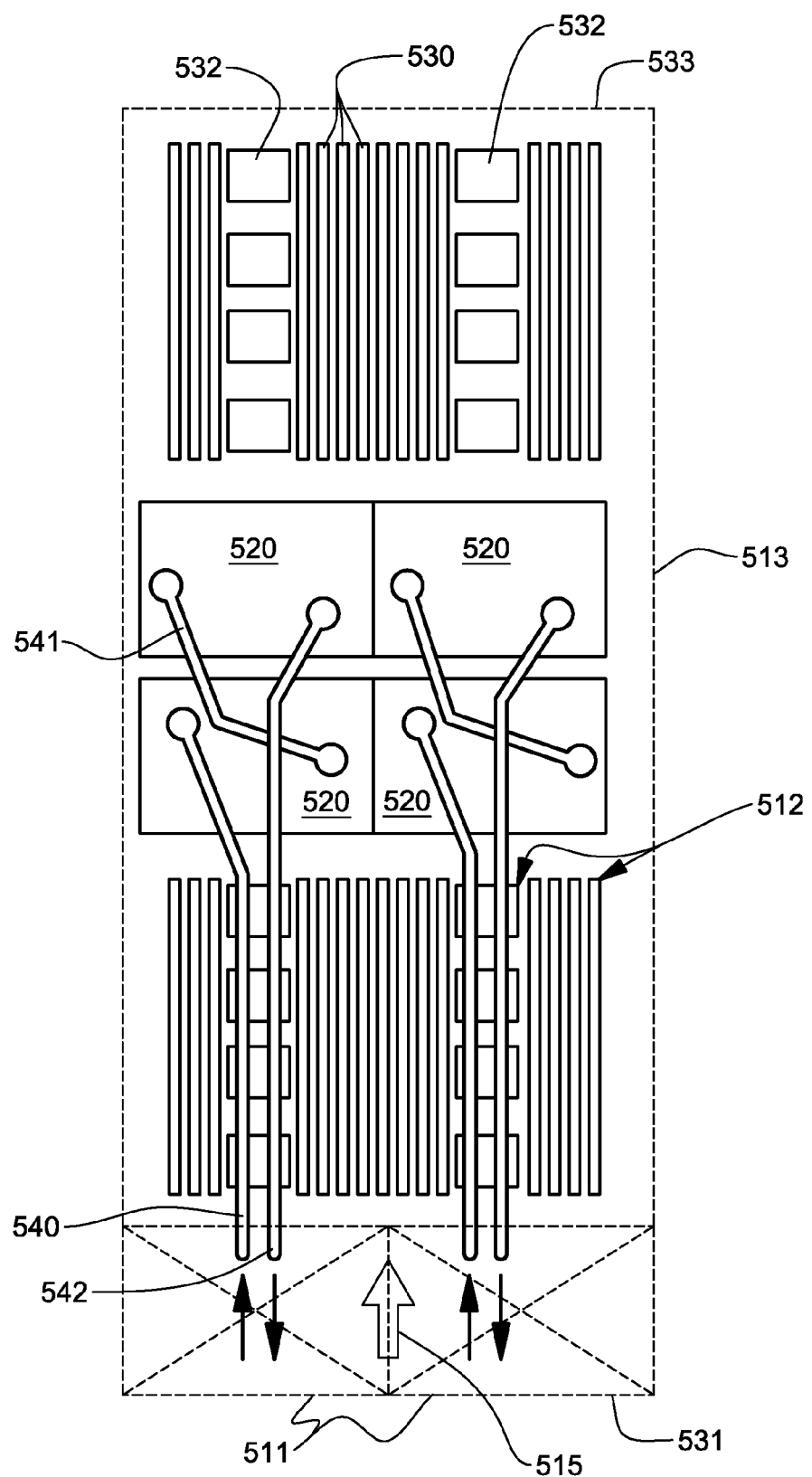
FIG. 5 is a plan view of one embodiment of an electronic subsystem layout illustrating an air and liquid cooling system for cooling components of the electronic subsystem, in accordance with one or more aspects of the present invention.

FIG. 5 depicts one embodiment of an electronic subsystem 513 component layout wherein one or more air moving devices 511 provide forced air flow 515 to cool multiple components 512 within electronic subsystem 513. Cool air is taken in through a front 531 and exhausted out a back 533 of the drawer. The multiple components to be cooled include multiple processor modules to which liquid-cooled cold plates 520 (of a liquid-based cooling system) are coupled, as well as multiple arrays of memory modules 530 (e.g., dual in-line memory modules (DIMMs)) and multiple rows of memory support modules 532 (e.g., DIMM control modules) to which air-cooled heat sinks are coupled. In the embodiment illustrated, memory modules 530 and the memory support modules 532 are partially arrayed near front 531 of electronic subsystem 513, and partially arrayed near back 533 of electronic subsystem 513. Also, in the embodiment of FIG. 5, memory modules 530 and the memory support modules 532 are cooled by air flow 515 across the electronic subsystem.

The illustrated liquid-based cooling system further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6:
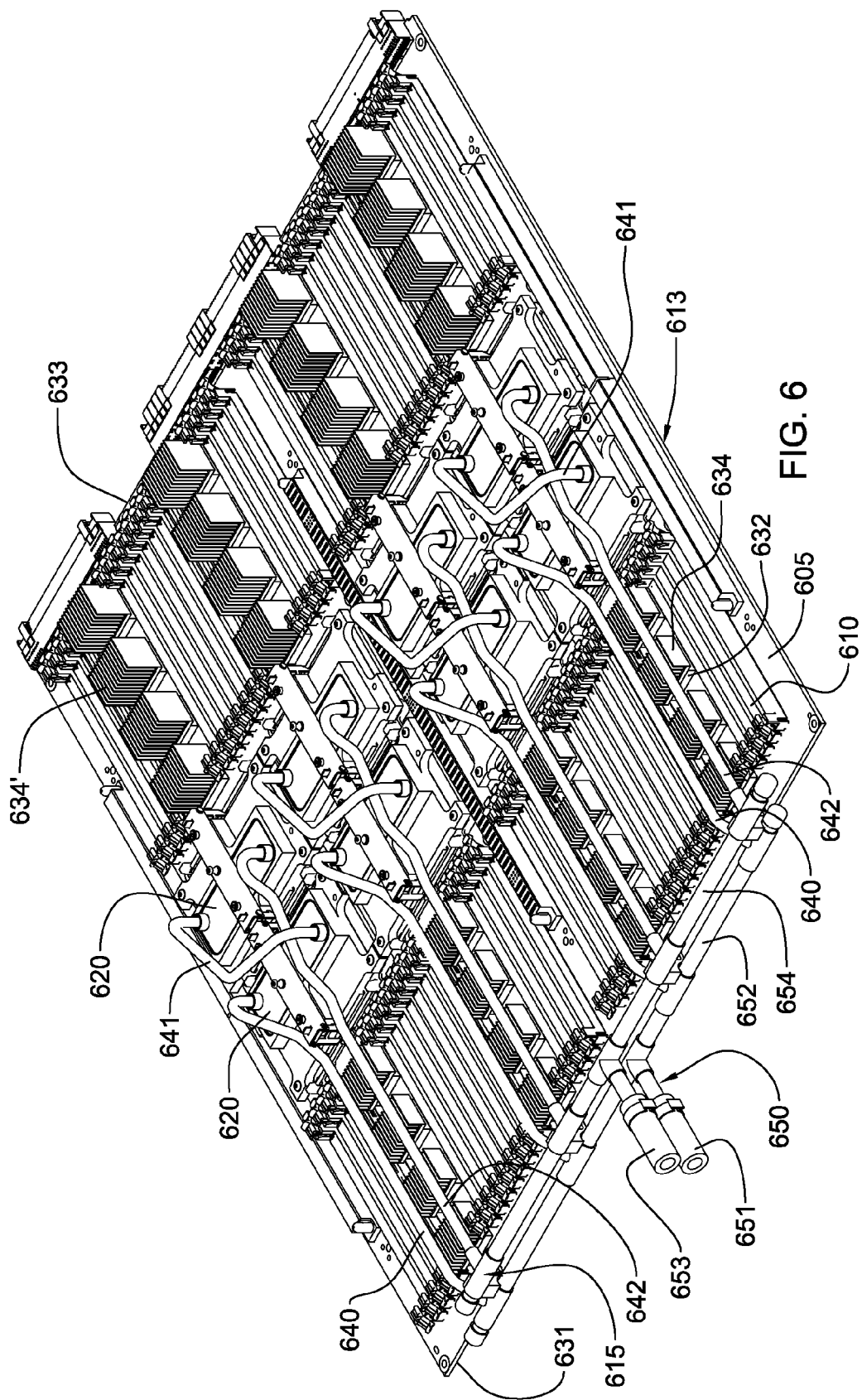
FIG. 6 depicts one detailed embodiment of a partially-assembled electronic subsystem layout, wherein the electronic subsystem includes eight heat-generating electronics components to be actively cooled, each having a respective liquid-cooled structure of a liquid-based cooling system coupled thereto, in accordance with one or more aspects of the present invention.

FIG. 6 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat-generating electronic components of an electronic system, and thereby more effectively maintain the components at a desirable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronic system implementation. These more robust cooling systems have unique problems in their assembly and implementation. For example, one assembly solution is to utilize multiple fittings within the electronic system, and use flexible plastic or rubber tubing to connect headers, cold plates, pumps and other components. However, such a solution may not meet design requirements.

Thus, presented herein in one aspect is a robust liquid-assisted cooling system specially preconfigured and prefabricated as a monolithic structure for positioning within a particular electronics drawer.

FIG. 6 is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 6 depicts a partially assembled electronic system 613 and an assembled liquid-based cooling system 615 coupled to primary heat-generating components (e.g., including processor dies) to be cooled. In this embodiment, the electronics system is configured for (or as) an electronics drawer of an electronics rack, and includes, by way of example, a support substrate or planar board 605, a plurality of memory module sockets 610 (with the memory modules (e.g., dual in-line memory modules) not shown), multiple rows of memory support modules 632 (each having coupled thereto an air-cooled heat sink 634), and multiple processor modules (not shown) disposed below the liquid-cooled cold plates 620 of the liquid-based cooling system 615.

In addition to liquid-cooled cold plates 620, liquid-based cooling system 615 includes multiple coolant-carrying tubes, including coolant supply tubes 640 and coolant return tubes 642 in fluid communication with respective liquid-cooled cold plates 620. The coolant-carrying tubes 640, 642 are also connected to a header (or manifold) subassembly 650 which facilitates distribution of liquid coolant to the coolant supply tubes and return of liquid coolant from the coolant return tubes 642. In this embodiment, the air-cooled heat sinks 634 coupled to memory support modules 632 closer to front 631 of electronics drawer 613 are shorter in height than the air-cooled heat sinks 634' coupled to memory support modules 632 near back 633 of electronics drawer 613. This size difference is to accommodate the coolant-carrying tubes 640, 642 since, in this embodiment, the header subassembly 650 is at the front 631 of the electronics drawer and the multiple liquid-cooled cold plates 620 are in the middle of the drawer.

Liquid-based cooling system 615 comprises a pre-configured monolithic structure which includes multiple (pre-assembled) liquid-cooled cold plates 620 configured and disposed in spaced relation to engage respective heat-generating electronic components. Each liquid-cooled cold plate 620 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 620 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 6, header subassembly 650 includes two liquid manifolds, i.e., a coolant supply header 652 and a coolant return header 654, which in one embodiment, are coupled together via supporting brackets. In the monolithic cooling structure of FIG. 6, the coolant supply header 652 is metallurgically bonded in fluid communication to each coolant supply tube 640, while the coolant return header 654 is metallurgically bonded in fluid communication to each coolant return tube 642. A single coolant inlet 651 and a single coolant outlet 653 extend from the header subassembly for coupling to the electronics rack's coolant supply and return manifolds (not shown).

FIG. 6 also depicts one embodiment of the pre-configured, coolant-carrying tubes. In addition to coolant supply tubes 640 and coolant return tubes 642, bridge tubes or lines 641 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 640, bridge tubes 641 and coolant return tubes 642 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

The above-described liquid cooling approach of FIGS. 2-6 is an effective solution for circulating water through liquid-cooled cold plates attached to heat-generating circuit modules (or components). An example of the efficacy of this approach is the IBM Power 575™ system offered by International Business Machines Corporation, Armonk, N.Y. In the embodiment of FIGS. 2-6, one or more coolant conditioning units containing a pump and, for example, a water-to-water heat exchanger, are disposed within each electronics rack. As explained above, heat load carried by the system coolant circulating through the liquid-cooled components in the liquid-cooled electronics rack is rejected to facility chilled water passing through the second coolant path through the active water-to-water heat exchangers within the coolant conditioning units disposed within the rack units.

As noted, in one implementation, the above-described cooling subassemblies for a particular electronic system (or subsystem) are relatively rigid structures employing, for example, rigid tubing interconnecting liquid-cooled cold plates and the headers (or manifold structures). In such an implementation, the multiple cold plates may be designed, by way of example, with a one to two millimeter compliance to accommodate differences in component or module height. Relative movement between the cold plates, however, larger than the specified compliance would damage the cooling apparatus. With such a cooling approach, in order to replace a single electronic component, the entire cooling apparatus must be removed, which would only be permitted in a manufacturing environment. Thus, field replacement (i.e., replacement at a customer facility), of an electronic component or module being cooled by such a cooling apparatus is not permitted. Therefore, if a single electronic component attached to the cold plate assembly fails, the entire electronic subsystem (or node) must be replaced. To address this, it is desirable to provide a liquid-based cooling apparatus which allows for replacement of an individual electronic component or module at the customer facility, rather than having to send the entire electronic subsystem (or node) back to the manufacturing site.

Provided herein is a cooling apparatus which allows the "in-field" detaching of a single cold plate from its respective electronic component or module to facilitate replacement of the electronic component. In particular, disclosed herein is a cooling apparatus which facilitates removal of, for example, an individual processor module or electronic component without disturbing other processor modules associated with the cooling apparatus. This is accomplished by providing a coolant manifold structure which allows for rotating or swiveling of one or more sections of the manifold structure. This degree of rotational motion facilitates the use of conduits or tubing between the manifold and the liquid-cooled structures that are relatively rigid and less flexible than would otherwise be required if the cold plate movement were to be fully accommodated by the conduits.

Generally stated, provided herein is a cooling apparatus which includes one or more coolant-cooled structures, each configured to attach to one or more respective electronic components to be cooled. The coolant-cooled structures include one or more coolant-carrying channels, and the coolant-carrying channels of the coolant-cooled structures are coupled via respective coolant conduits in fluid communication with one or more coolant manifolds. The one or more coolant manifolds include at least one rotatable manifold section. In operation, respective coolant conduits couple the rotatable manifold section(s) to respective coolant-cooled structure(s) of the cooling apparatus, and with rotation of the rotatable manifold section(s), allow the coolant-cooled structure(s) to be detached from the respective electronic component while maintaining the coolant-cooled structure in fluid communication with the rotatable manifold section through the respective coolant conduits, which in one embodiment, may be substantially rigid conduits.

Figure 7A:
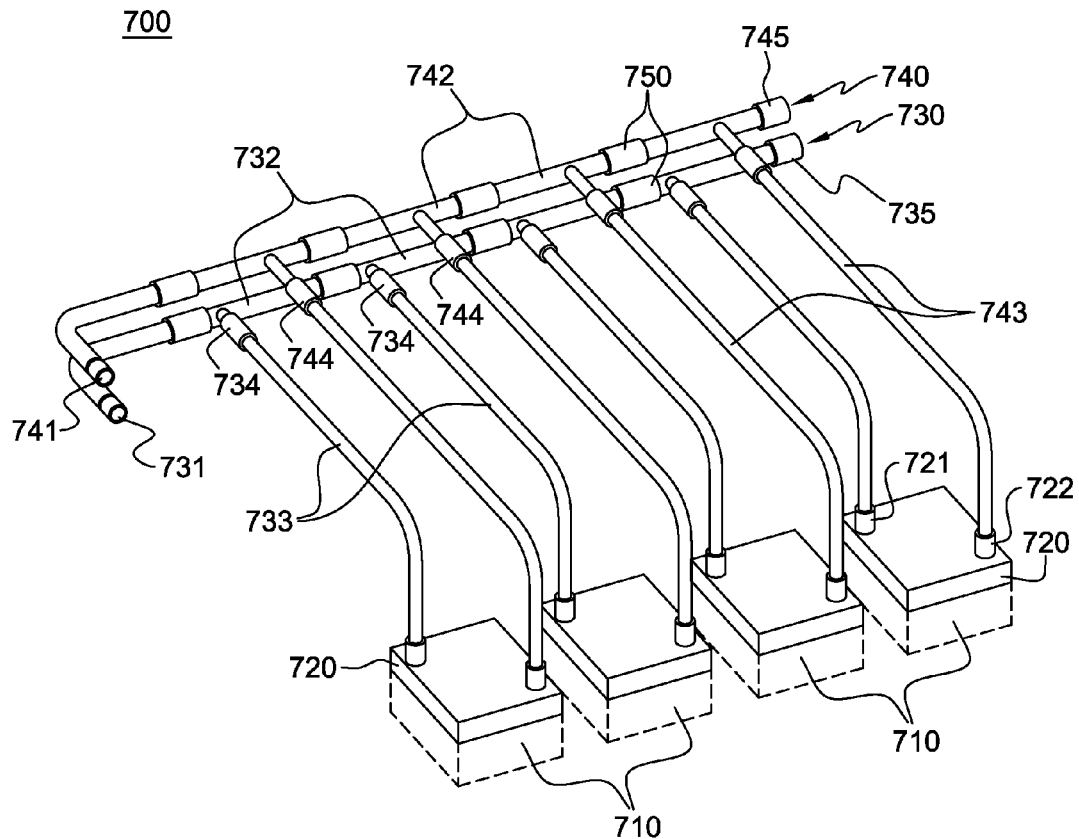
FIG. 7A depicts one embodiment of a cooling apparatus comprising multiple coolant-cooled structures, and coolant supply and return manifolds, each with multiple rotatable manifold sections, in accordance with one or more aspects of the present invention.
Figure 7B:
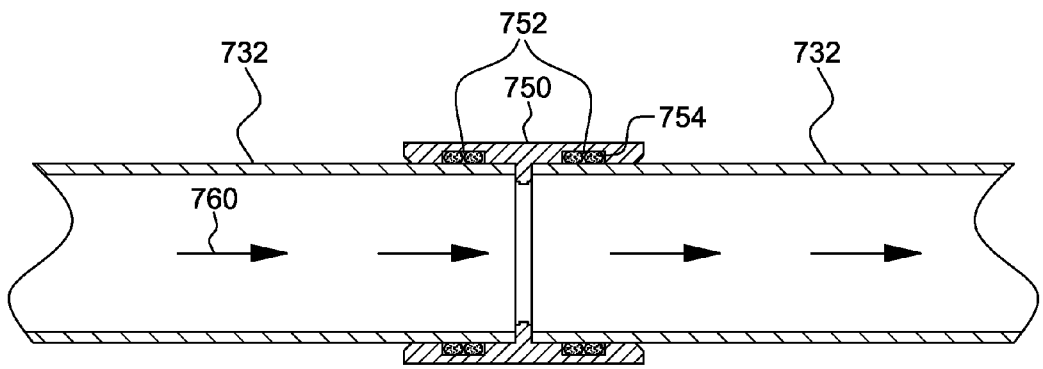
FIG. 7B is a partial cross-sectional view of one of the coolant supply manifold or coolant return manifold of FIG. 7A, and illustrates adjoining rotatable manifold sections being movably coupled to each other via a respective swivel fitting, in accordance with one or more aspects of the present invention.

Multiple implementations of the above-summarized cooling apparatus are described herein by way of example. In a first embodiment, the coolant manifold comprises separate coolant supply and coolant return manifolds (or headers), each with one or more independently-rotatable manifold sections. One implementation of this embodiment is depicted in FIGS. 7A & 7B, wherein the supply manifold and the return manifold each comprise multiple series-connected, rotatable manifold sections, and wherein each manifold section includes rotatable seals that prevent coolant leakage from the manifold. In another embodiment, an integrated coolant manifold is disclosed which is an integrated structure comprising a coolant supply plenum and a coolant return plenum, as well as multiple rotatable manifold sections. Each rotatable manifold section includes an inner tube section and an outer tube section, which in one embodiment, may comprise concentric tube sections. The inner tube section and the outer tube section of a given rotatable manifold section each have a respective coolant port which allows for the supply or return of coolant from the respective coolant supply or return plenum. One embodiment of this structure is depicted in FIGS. 8A-8H, by way of example only.

First, referring collectively to FIGS. 7A-7B, one embodiment of a cooling apparatus 700 is depicted, in accordance with one or more aspects of the present invention. In this embodiment, cooling apparatus 700 comprises separate coolant supply and coolant return manifolds 730, 740.

More particularly, cooling apparatus 700 comprises one or more liquid-cooled structures (or cold plates) 720 attach to one or more respective electronic components 710, such as processor modules. Coolant supply conduits 733 and coolant return conduits 743 respectively couple the coolant supply manifold 730 and coolant return manifold 740 in fluid communication with the coolant inlets 721 and coolant outlets 722 of the liquid-cooled structures 720. In addition, respective tube fittings (or ports) 734, 744 at the supply and return manifolds 730, 740 facilitate coupling coolant supply conduits 733 and coolant return conduits 743 in fluid communication with the respective manifold sections 732, 742 of the coolant supply and return manifolds 730, 740. As noted, the coolant supply manifold 730 comprises, in one example, multiple rotatable manifold sections 732 movably coupled to each other in series fluid communication via respective swivel fittings 750, and the coolant return manifold 740 comprises multiple rotatable manifold sections 742 movably coupled to each other in series fluid communication via additional respective swivel fittings 750. Coolant supply manifold 730 further includes a coolant supply port 731 and an end cap 735 at opposite ends of the manifold, and coolant return manifold 740 includes a coolant return port 741 and an end cap 745 at opposite ends of the coolant return manifold.

By way of example, FIG. 7B illustrates a movable coupling via a swivel fitting 750 of two adjacent rotatable manifold sections 732 of coolant supply manifold 730. Note that the rotatable manifold sections of the coolant return manifold could be similarly coupled. As noted, adjacent rotatable manifold sections 732 are coupled via a respective swivel fitting 750, which in one embodiment may comprise a ring-shaped swivel fitting that surrounds and joins the opposing ends of the adjacent rotatable manifold sections 732. Swivel fitting 750 includes, in this embodiment, circumferential grooves 752, each of which accommodates one or more annular O-rings 754 that facilitate preventing coolant 760 leaking at the swivel fitting 750. If desired, a locking or latching mechanism (not shown), such as that described below, or any other conventional locking or latching mechanism, could be employed to interconnect the adjoining rotatable manifold sections of a given manifold, while still allowing for rotation of one rotatable manifold section relative to its adjoining rotatable manifold section(s).

Also, those skilled in the art will note that the cooling apparatus or subassembly depicted in FIGS. 7A & 7B could be readily implemented with a single rotatable manifold section in the coolant supply manifold, and a single rotatable manifold section in the coolant return manifold. In that case, rotation of the two single, rotatable manifold sections of the coolant supply and return manifolds could detach multiple liquid-cooled structures from their respective electronic components. Note that in the depicted embodiment of FIGS. 7A & 7B, the supply and return manifolds are offset from one another, meaning that multiple axes of rotation exist. Thus, the coolant supply conduits connecting the manifolds to the liquid-cooled structures in this embodiment should have enough flexibility to accommodate this motion. By way of example, stiff plastic conduits such as Teflon™ (PTFE) or polyether ether ketone (PEEK) could be employed. In the case of plastic conduits, as in many other cases, stiffness is a relative term. However, in terms of the present application, the plastic conduits are not flexible enough to move the respective liquid-cooled structure sufficiently to detach the liquid-cooled structure from the associated electronic component without the freedom of movement of the rotatable manifold sections disclosed herein.

FIGS. 8A-8H depict an alternate embodiment of a cooling apparatus, generally denoted 800, in accordance with an aspect of the present invention. In this embodiment, an integrated manifold structure 830 is provided, which comprises both a coolant supply plenum and a coolant return plenum, as described further below.

As illustrated in FIG. 8A, cooling apparatus 800 comprises one or more liquid-cooled structures 820, each of which is coupled or attached to one or more respective electronic components 810 to be cooled. By way of example, an electronic component 810 might comprise a high-heat-generating electronic component such as a processor module, as noted above. As illustrated, each coolant supply conduit 840 couples in fluid communication a coolant inlet 821 (of a respective liquid-cooled structure 820) and a coolant supply port 841 (of a respective rotatable manifold section 835 of the integrated manifold structure 830). Similarly, each coolant return conduit 850 couples in fluid communication a coolant outlet 822 (of the respective liquid-cooled structure 820) and a coolant return port 851 (of the respective rotatable manifold section 835). The conduits 840, 850 may be connected to the liquid-cooled structures and to the integrated coolant manifold in a number of ways, including, soldering, brazing, mechanically coupling, etc. The conduits could even be formed integral with either the liquid-cooled structures or the integrated manifold.

In the embodiment illustrated, integrated manifold 830 further includes a coolant inlet port 831, a coolant outlet port 832, and a fixed inlet outlet coupling 833 at one end of the integrated coolant manifold 830, and a cap 834 at the other end of the integrated coolant manifold. Integrated coolant manifold 830 comprises, by way of example, multiple series-coupled rotatable manifold sections 835. Note, however, that the integrated coolant manifold could, in an alternate embodiment, be configured with a single rotatable coolant manifold section which may comprise, for example, one or more coolant supply ports 841 and one or more coolant return ports 851 for supplying coolant to one or more liquid cooled structures 820 of the cooling apparatus.

Also, although depicted herein as comprising an inlet port 821 and an outlet port 822 coupled via respective coolant supply and coolant return conduits 840, 850 to respective rotatable manifold sections of the integrated coolant manifold 830, one or more cold plate interconnecting tubes (not shown) could couple multiple liquid-cooled structures 820 together via, for example, coupling an outlet port 822 of a first liquid-cooled structure 820 to an inlet port 821 of a second liquid-cooled structure 820, in a manner such as depicted and described above in connection with FIG. 6. In such a case, the two or more coupled liquid-cooled structures would detach from their respective electronic components with rotation of the respective rotatable manifold section 835 of integrated coolant manifold 830.

Figure 8B:
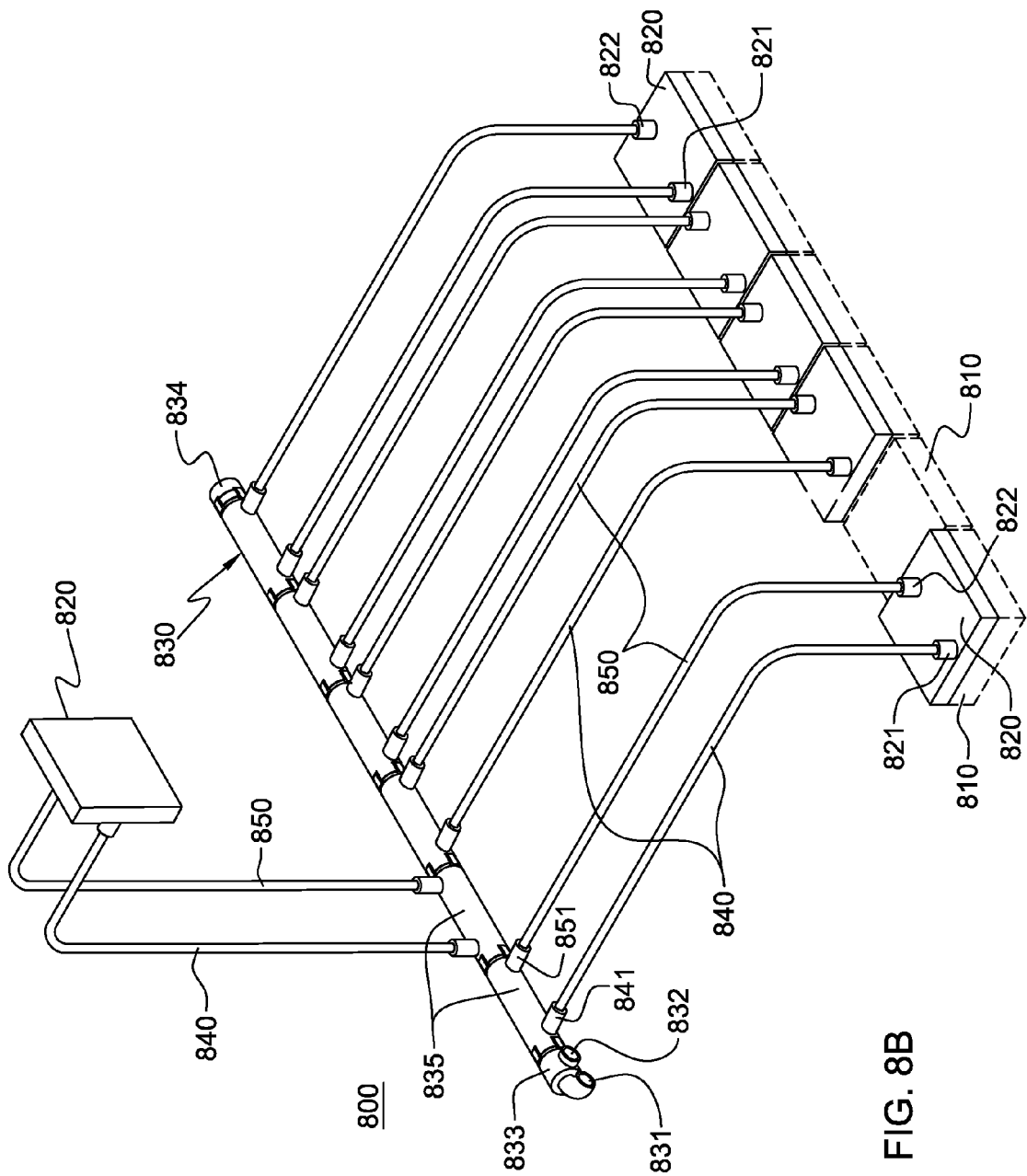
FIG. 8B depicts the cooling apparatus of FIG. 8A, with one rotatable manifold section turned 90 degrees to detach the coupled coolant-cooled structure from its respective electronic component(s), in accordance with one or more aspects of the present invention.

Advantageously, the cooling apparatus depicted in FIG. 8A comprises multiple rotatably coupled manifold sections 835, each of which facilitates detaching of a respective liquid-cooled structure 820 from the one or more associated electronic components 810 being cooled via that liquid-cooled structure. This can be accomplished by rotating or swiveling one or more of the rotatable manifold sections 835, as illustrated (by way of example) in FIG. 8B. In FIG. 8B, a 90 degree swivelable motion is illustrated, which facilitates the use of rigid conduits 840, 850 between the liquid-cooled structures and the manifold sections. The rigid conduits are conduits that are less flexible than would otherwise be needed if movement of the liquid-cooled structure had to be accommodated by the conduit itself.

Figure 8C:
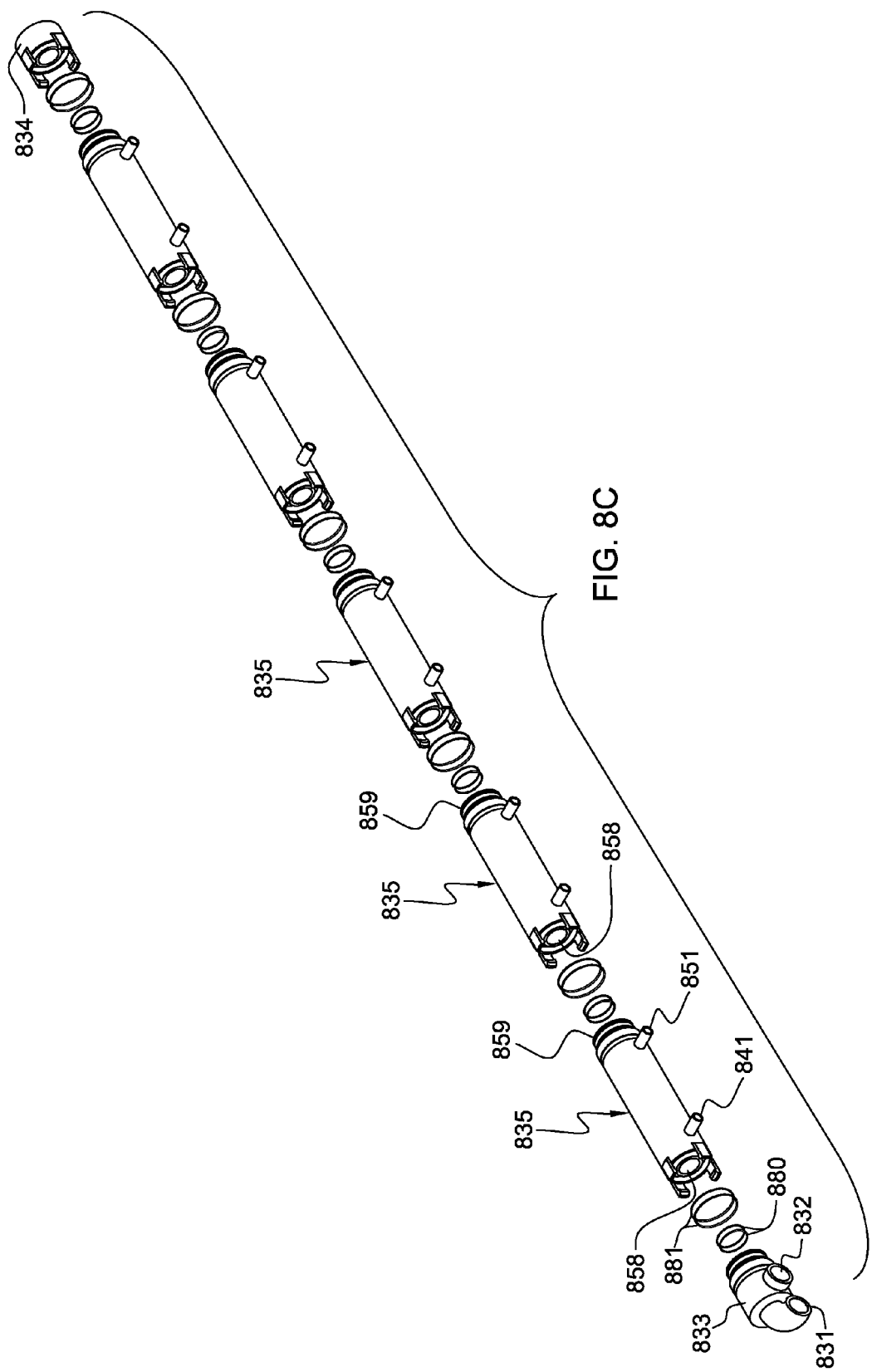
FIG. 8C is an exploded view of one embodiment of the integrated coolant manifold of FIGS. 8A & 8B, in accordance with one or more aspects of the present invention.
Figure 8D:
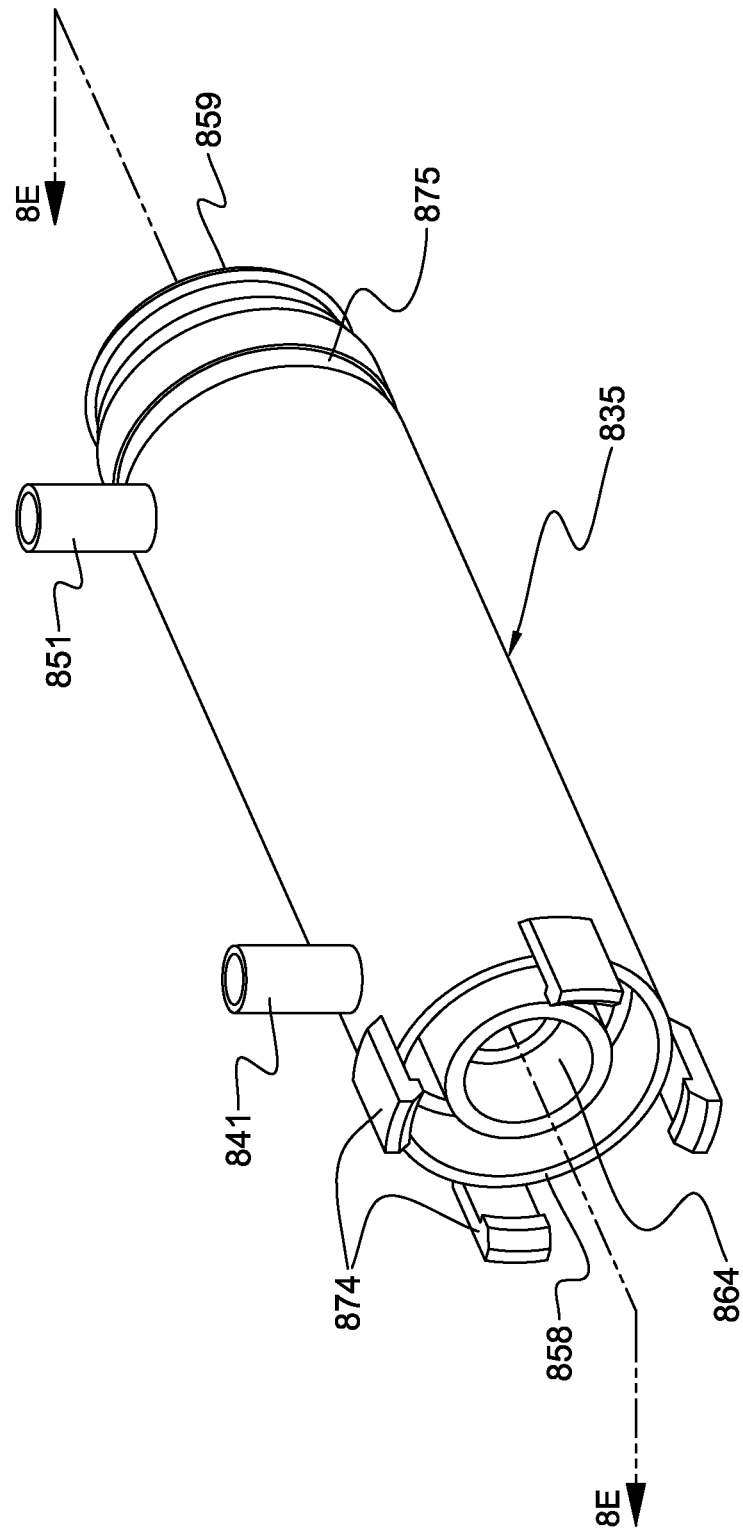
FIG. 8D is an isometric view of one rotatable manifold section of the integrated coolant manifold of FIGS. 8A-8C, in accordance with one or more aspects of the present invention.
Figure 8E:
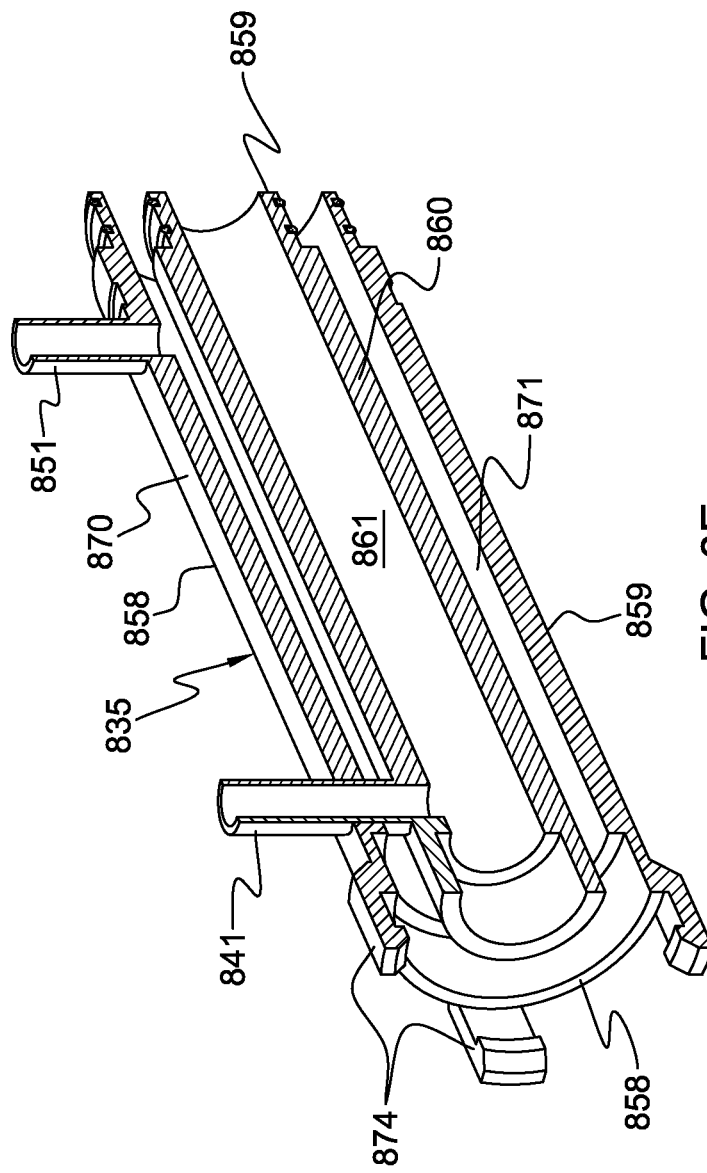
FIG. 8E is a cross-sectional isometric view of the rotatable manifold section of FIG. 8D, taken along line 8E-8E thereof, in accordance with one or more aspects of the present invention.
Figure 8F:
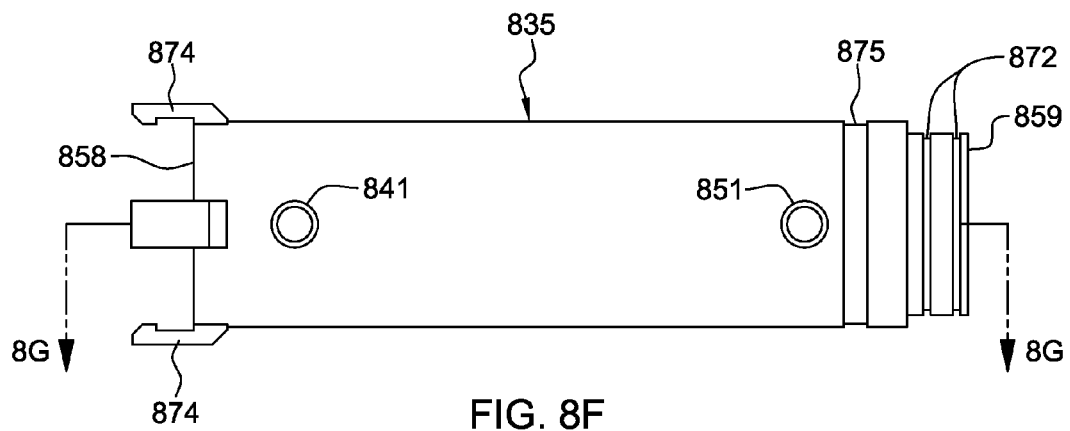
FIG. 8F is an elevational view of the rotatable manifold section of FIG. 8D, in accordance with one or more aspects of the present invention.
Figure 8G:
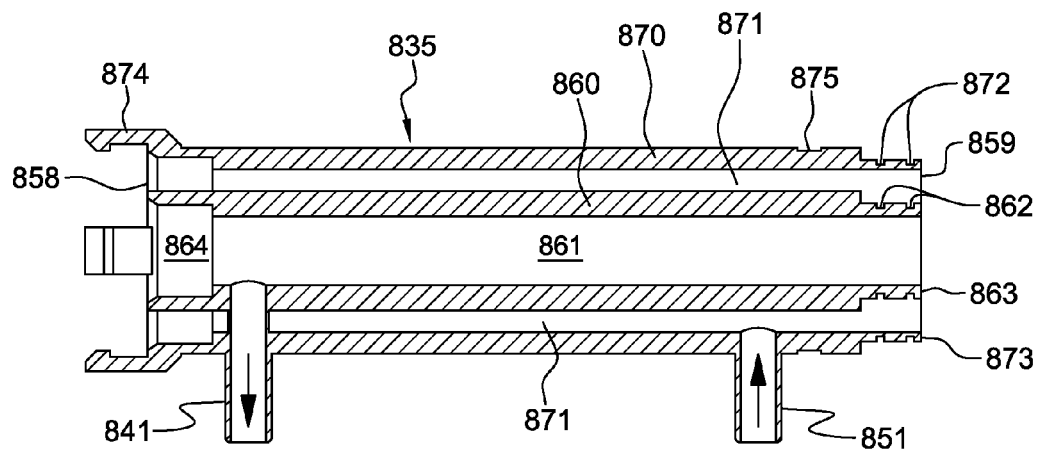
FIG. 8G is a cross-sectional view of the rotatable manifold section of FIG. 8F, taken along line 8G-8G thereof, in accordance with one or more aspects of the present invention.
Figure 8H:
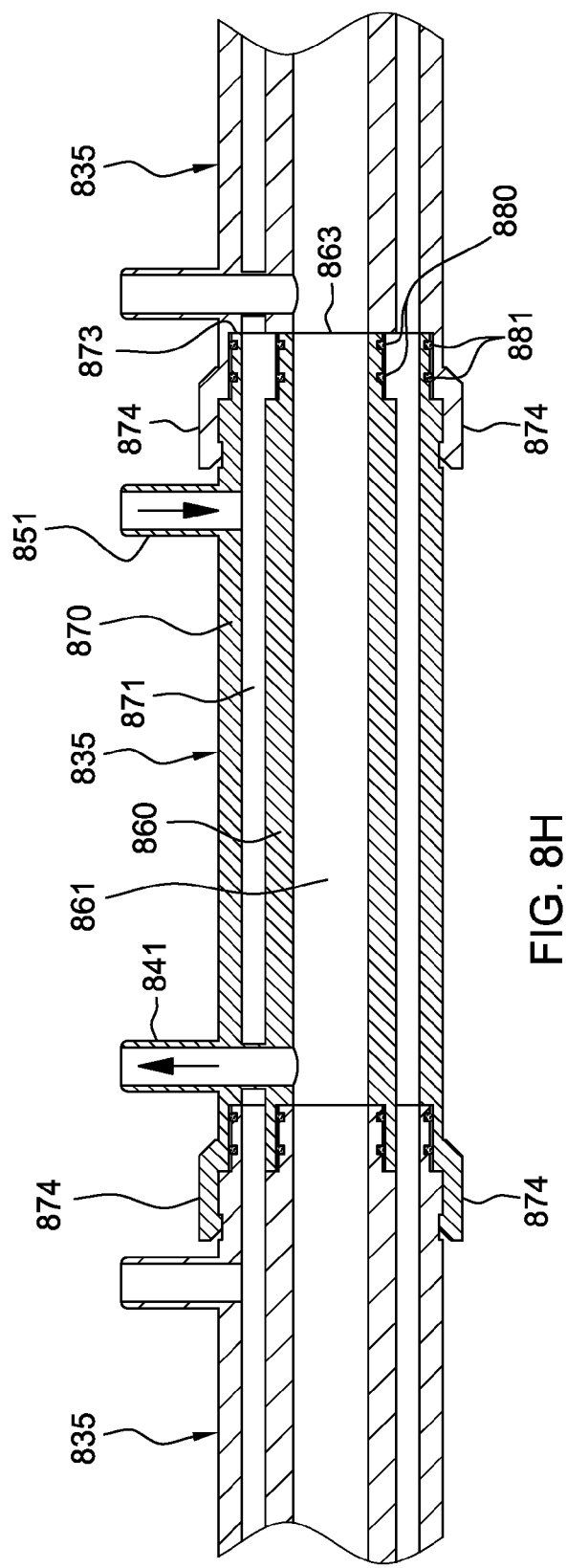
FIG. 8H is a partial cross-sectional view of the integrated coolant manifold of FIGS. 8A-8C, and showing adjacent rotatable manifold sections coupled in fluid communication, in accordance with one or more aspects of the present invention.

FIG. 8C is a partially exploded depiction of the integrated coolant manifold of FIGS. 8A & 8B, while FIGS. 8D-8G depict in greater detail one embodiment of a rotatable manifold section 835, and FIG. 8H depicts a cross-sectional view of adjacent rotatable manifold sections coupled within the integrated coolant manifold.

Referring collectively to FIGS. 8C-8H, in the embodiment depicted, each rotatable manifold section 835 comprises a first end 858 and a second end 859, with the rotatable manifold sections being substantially identical in the embodiment illustrated. Note that this embodiment is provided by way of example only. In alternate embodiments, the rotatable manifold sections could be differently sized or configured for a particular cooling implementation. For example, one or more of the rotatable manifold sections 835 might be longer than one or more other rotatable manifold sections of the integrated coolant manifold. As noted above with respect to FIGS. 8A & 8B, each rotatable manifold section 835 comprises coolant supply and return ports 841, 851 which facilitate circulation of coolant from the manifold through the respective liquid-cooled structures via respective coolant supply and return conduits. As noted, fixed inlet outlet coupling 833 includes coolant inlet port 831 and coolant outlet port 832, which are in fluid communication via the coupling 833 to respective coolant supply and return plenums in the adjoining rotatable manifold section 835. In one embodiment, coupling 833 comprises a dual plenum structure similar to that described below with reference to the rotatable manifold sections 835. For example, coupling 833 might comprise two concentric tube sections which define an inner plenum and a surrounding plenum that are configured to respectively align and seal to the coolant supply plenum and coolant return plenum of the adjoining rotatable manifold section 835 in a manner similar to that described below.

Referring specifically to FIGS. 8D-8G, one embodiment of rotatable manifold section 835 is depicted. In this embodiment, first end 858 is configured to receive a second end 859 of an adjacent rotatable manifold section (as illustrated in FIG. 8H). The rotatable manifold section 835 includes an inner tube section 860 and an outer tube section 870, which in one embodiment, are concentric, and spaced apart to define a first coolant plenum and a second coolant plenum. In one embodiment, the first and second coolant plenums comprise the coolant supply and the coolant return plenums 861, 871, respectively. Smaller-diameter tubes or ports 841, 851 are provided branching from inner tube section 860 and outer tube section 870, as illustrated, to provide for the supply and return of coolant flow to the liquid-cooled structures, as described above. As shown, coolant supply port 841 is in fluid communication with coolant supply plenum 861, and coolant return port 851 is in fluid communication with coolant return plenum 871.

By way of example, dual O-ring grooves 862 are provided at an end 863 of inner tube section 860 to reside within an adjoining space 864 at first end 858 of the adjoining rotatable manifold section, as represented by FIGS. 8G & 8H. Within these dual O-ring grooves 862, dual O-rings 880 are provided to facilitate sealing the adjoining coolant supply plenums 861 together at the interface between the adjacent rotatable manifold sections 835. Similarly, dual O-ring grooves 872 are provided in outer tube section 870 at an end 873 of outer tube section 870 to accommodate larger diameter dual O-rings 881, which facilitate sealing the adjoining coolant return plenums 871 together at the interface between the adjacent rotatable manifold sections 835, as illustrated in FIG. 8H. Note that double O-rings are employed in this example to ensure reliability. Alternatively, a single O-ring could be provided in association with the inner tube section, and a single O-ring could be provided in association with the outer tube section, if desired. Note also that the rotatable manifold sections 835 are locked or latched together via, for example, latching tabs 874 extending from one rotatable manifold section at end 858, and engaging respective latching grooves (or channels) 875 in the adjoining rotatable manifold section at end 859. In one embodiment, the latching grooves each comprise a circumferential groove in the outer tube section 870. While latching tabs and corresponding grooves are illustrated, any conventional latching or locking technique may be employed, including set screws, retaining clips, etc., for example, with associated grooves or channels, provided that they allow for rotational or swiveable movement of one rotatable manifold section relative to at least another portion of the integrated coolant manifold.

Advantageously, the integrated coolant manifold described herein with reference to FIGS. 8A-8H has a single axis of rotation for both the supply and return plenums, and the associated coolant conduits. This structure thus allows for rigid conduits or tubings to be employed between the integrated coolant manifold and the liquid-cooled structures. For example, metal tubes (such as copper, stainless steel, aluminum, etc.) or stiff plastics (such as Teflon™ (PTFE) or polyether ether ketone (PEEK)) could be employed for this purpose. In the case of plastics, as in many other cases, stiffness is a relative term. However, the metals and plastics employed in the cooling apparatus described herein are assumed to be insufficiently flexible to move the associated liquid-cooled structure(s) enough to replace the respective electronic component without the freedom to rotate the manifold section.

Note further that the integrated manifold described herein with reference to FIGS. 8A-8H could be readily implemented as a single rotatable manifold section, or as multiple rotatable manifold sections, each coupled to multiple liquid-cooled structures via respective supply and return conduits. In such a case, rotation of a single rotatable manifold section would simultaneously detach multiple associated liquid-cooled structures from their respective one or more electronic component(s).

Those skilled in the art will note that disclosed herein is a liquid-based cooling apparatus which facilitates removal of an individual electronic component, such as a processor module, without disturbing other electronic components being cooled by the cooling apparatus. This is accomplished by rotating or swiveling one or more rotatable manifold sections of one or more coolant manifolds so as to detach the respective liquid-cooled structure from the electronic component(s). The provided degree of rotational motion facilitates the use of conduits between the manifold(s) and the liquid-cooled structure(s), which are less flexible than would otherwise be required if detaching of the liquid-cooled structures were to be accommodated by the conduits themselves. As noted herein, employing rigid interconnecting conduits provides a more robust liquid-assisted cooling system than attainable using flexible conduits.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A cooling apparatus comprising:
multiple coolant-cooled structures configured to attach to multiple electronic components to be cooled, one coolant-cooled structure of the multiple coolant-cooled structures comprising at least one coolant-carrying channel through which coolant flows from a coolant inlet to a coolant outlet of the one coolant-cooled structure;
multiple coolant supply conduits, one coolant supply conduit of the multiple coolant supply conduits being coupled in fluid communication with the coolant inlet of the one coolant-cooled structure to facilitate flow of the coolant therethrough;
multiple coolant return conduits, one coolant return conduit of the multiple coolant return conduits being coupled in fluid communication with the coolant outlet of the one coolant-cooled structure; and
a coolant supply manifold and a coolant return manifold coupled in fluid communication with the multiple coolant supply conduits and the multiple coolant return conduits, respectively, for supplying the coolant to the multiple coolant-cooled structures, and exhausting the coolant from the multiple coolant-cooled structures, at least one of the coolant supply manifold or the coolant return manifold comprising at least one rotatable manifold section, wherein at least one of the one coolant supply conduit or the one coolant return conduit is coupled in fluid communication with the at least one rotatable manifold section to facilitate flow of the coolant through the at least one coolant-carrying channel of the one coolant-cooled structure, and wherein the at least one rotatable manifold section is in fluid communication with and rotatable relative to another, separately rotatable portion of the coolant supply and return manifolds to facilitate detaching of the one coolant-cooled structure from a respective electronic component of the multiple electronic components, while maintaining the one coolant-cooled structure in fluid communication with the at least one rotatable manifold section through the at least one of the one coolant supply conduit or the one coolant return conduit.

2. The cooling apparatus of claim 1, wherein the coolant supply and return manifolds comprise multiple rotatable manifold sections, the multiple rotatable manifold sections comprising the at least one rotatable manifold section, each rotatable manifold section of the multiple rotatable manifold sections being separately rotatable, and wherein the another, separately rotatable portion of the coolant supply and return manifolds comprises another rotatable manifold section of the multiple rotatable manifold sections.

3. The cooling apparatus of claim 2, wherein adjacent rotatable manifold sections of the multiple rotatable manifold sections are movably coupled to each other in series fluid communication via a respective swivel fitting.

4. The cooling apparatus of claim 3, wherein the respective swivel fitting comprises at least one circumferential groove accommodating an annular O-ring between the respective swivel fitting and one of the adjacent rotatable manifold sections movably coupled to each other via the respective swivel fitting.

5. The cooling apparatus of claim 1, wherein the coolant supply and return manifolds are coupled as an integrated coolant manifold, and one of the coolant supply manifold or the coolant return manifold is at least partially encircled by the other of the coolant supply manifold or the coolant return manifold.

6. The cooling apparatus of claim 5, wherein the integrated coolant manifold comprises the at least one rotatable manifold section, each rotatable manifold section of the at least one rotatable manifold section of the integrated coolant manifold comprising an inner tube section and an outer tube section, the outer tube section at least partially encircling the inner tube section.

7. The cooling apparatus of claim 6, wherein the inner tube section and the outer tube section are concentric.

8. The cooling apparatus of claim 1, wherein the one coolant supply conduit and the one coolant return conduit are each, substantially rigid coolant conduits.

9. A cooled electronic system comprising:
multiple electronic components; and
a cooling apparatus attached to the multiple electronic components and facilitating removal of heat from the multiple electronic components, the cooling apparatus comprising:
multiple coolant-cooled structures configured to attach to the multiple electronic components to be cooled, one coolant-cooled structure of the multiple coolant-cooled structures comprising at least one coolant-carrying channel through which coolant flows from a coolant inlet to a coolant outlet of the one coolant-cooled structure;
multiple coolant supply conduits, one coolant supply conduit of the multiple coolant supply conduits being coupled in fluid communication with the coolant inlet of the one coolant-cooled structure to facilitate flow of the coolant therethrough;
multiple coolant return conduits, one coolant return conduit of the multiple coolant return conduits being coupled in fluid communication with the coolant outlet of the one coolant-cooled structure; and
a coolant supply manifold and a coolant return manifold coupled in fluid communication with the multiple coolant supply conduits and the multiple coolant return conduits, respectively, for supplying the coolant to the multiple coolant-cooled structures, and exhausting the coolant from the multiple coolant-cooled structures, at least one of the coolant supply manifold or the coolant return manifold comprising at least one rotatable manifold section, wherein at least one of the one coolant supply conduit or the one coolant return conduit is coupled in fluid communication with the at least one rotatable manifold section to facilitate flow of the coolant through the at least one coolant-carrying channel of the one coolant-cooled structure, and wherein the at least one rotatable manifold section is in fluid communication with and rotatable relative to another, separately rotatable portion of the coolant supply and return manifolds to facilitate detaching of the one coolant-cooled structure from a respective electronic component of the multiple electronic components, while maintaining the one coolant-cooled structure in fluid communication with the at least one rotatable manifold section through the at least one of the one coolant supply conduit or the one coolant return conduit.

10. The cooled electronic system of claim 9, wherein the coolant supply and return manifolds comprise multiple rotatable manifold sections, the multiple rotatable manifold sections comprising the at least one rotatable manifold section, each rotatable manifold section of the multiple rotatable manifold sections being separately rotatable, and wherein the another, separately rotatable portion of the coolant supply and return manifolds comprises another rotatable manifold section of the multiple rotatable manifold sections.

11. The cooled electronic system of claim 10, wherein adjacent rotatable manifold sections of the multiple rotatable manifold sections are movably coupled to each other in series fluid communication via a respective swivel fitting.

12. The cooled electronic system of claim 11, wherein the respective swivel fitting comprises at least one circumferential groove accommodating an annular O-ring between the respective swivel fitting and one of the adjacent rotatable manifold sections movably coupled to each other via the respective swivel fitting.

13. The cooled electronic system of claim 9, wherein the coolant supply and return manifolds are coupled as an integrated coolant manifold, and one of the coolant supply manifold or the coolant return manifold is at least partially encircled by the other of the coolant supply manifold or the coolant return manifold.

14. The cooled electronic system of claim 13, wherein the integrated coolant manifold comprises the at least one rotatable manifold section, each rotatable manifold section of the at least one rotatable manifold section of the integrated coolant manifold comprising an inner tube section and an outer tube section, the outer tube section at least partially encircling the inner tube section.

15. The cooled electronic system of claim 14, wherein the inner tube section and the outer tube section are concentric.

16. The cooled electronic system of claim 9, wherein the one coolant supply conduit and the one coolant return conduit are each, substantially rigid coolant conduits.

* * * * *